(12) United States Patent
Wang et al.

(10) Patent No.: US 11,882,681 B2
(45) Date of Patent: Jan. 23, 2024

(54) ELECTROMAGNETIC SHIELDING STRUCTURE AND MANUFACTURING METHOD THEREOF, AND ELECTRONIC DEVICE

(71) Applicant: Weifang Goertek Microelectronics Co., Ltd., Shandong (CN)

(72) Inventors: Kaiwei Wang, Shandong (CN); Dewen Tian, Shandong (CN); Qinglin Song, Shandong (CN)

(73) Assignee: Weifang Goertek Microelectronics Co. Ltd., Weifang (CN)

( * ) Notice: Subject to any disclaimer, the term of this patent is extended or adjusted under 35 U.S.C. 154(b) by 79 days.

(21) Appl. No.: 17/614,844

(22) PCT Filed: Dec. 6, 2019

(86) PCT No.: PCT/CN2019/123557
§ 371 (c)(1),
(2) Date: Nov. 29, 2021

(87) PCT Pub. No.: WO2020/238139
PCT Pub. Date: Dec. 3, 2020

(65) Prior Publication Data
US 2022/0248573 A1 Aug. 4, 2022

(30) Foreign Application Priority Data
May 28, 2019 (CN) .......................... 201910455863.0

(51) Int. Cl.
*H05K 9/00* (2006.01)

(52) U.S. Cl.
CPC .................... *H05K 9/003* (2013.01)

(58) Field of Classification Search
CPC .................................................. H05K 9/0024
See application file for complete search history.

(56) References Cited

U.S. PATENT DOCUMENTS

2005/0258552 A1  11/2005  Kim
2006/0084289 A1*  4/2006  Ziberna ............... H05K 9/0022
                                          439/67
(Continued)

FOREIGN PATENT DOCUMENTS

CN    108010902 A    5/2018
CN    109300793 A    2/2019
(Continued)

*Primary Examiner* — Hung V Ngo
(74) *Attorney, Agent, or Firm* — Baker Botts, LLP

(57) ABSTRACT

Disclosed are an electromagnetic shielding structure and a manufacturing method thereof, and an electronic product. The manufacturing method includes covering an injection mold on a circuit substrate, so that different circuit units on the circuit substrate are respectively accommodated in different injection molding cavities of the injection mold; injecting a non-conductive plastic sealant into the injection molding cavities so as to form non-conductive plastic sealing bodies on the circuit units, wherein spacing grooves are formed between the non-conductive plastic sealing bodies; and forming a conductive shielding layer on the non-conductive plastic sealing bodies, so that the conductive shielding layer covers the non-conductive plastic sealing bodies and fills the spacing grooves to form shielding barrier walls, thereby realizing shielding between the different circuit units in respective cavities.

8 Claims, 4 Drawing Sheets

(56) References Cited

U.S. PATENT DOCUMENTS

| | | | | |
|---|---|---|---|---|
| 2012/0320558 A1* | 12/2012 | Foster | .................... | H01L 23/552 |
| | | | | 29/841 |
| 2015/0271959 A1* | 9/2015 | Chen | ....................... | H05K 3/284 |
| | | | | 361/760 |
| 2017/0311448 A1* | 10/2017 | Kawabata | ................ | H01L 25/16 |
| 2018/0206355 A1* | 7/2018 | Wittmann | .............. | H05K 1/181 |

FOREIGN PATENT DOCUMENTS

| | | |
|---|---|---|
| CN | 208706582 U | 4/2019 |
| CN | 109712964 A | 5/2019 |
| CN | 110213952 A | 9/2019 |

\* cited by examiner

ELECTROMAGNETIC SHIELDING STRUCTURE AND MANUFACTURING METHOD THEREOF, AND ELECTRONIC DEVICE

CROSS-REFERENCE TO RELATED APPLICATIONS

This application is a National Stage of International Application No. PCT/CN2019/123557, filed on Dec. 6, 2019, which claims priority to Chinese Patent Application No. 201910455863.0, filed on May 28, 2019, both of which are hereby incorporated by reference in its entirety.

TECHNICAL FIELD

The present disclosure relates to the field of electronic technology, and in particular, to an electromagnetic shielding structure and a manufacturing method thereof, and an electronic device.

BACKGROUND

In the prior art, in order to realize electromagnetic isolation (or electromagnetic shielding) between different electrical apparatus components such as radio frequency components, metal barrier walls or metal covers are typically added between electrical apparatus components. However, grooves for the metal barrier walls to fill in are usually formed through laser trenching, where expensive laser heads are used and can be used for limited times due to wear and tear in use, resulting in prohibitive manufacturing cost and a cumbersome manufacturing process for an existing electromagnetic shielding structure.

SUMMARY

A main objective of the present disclosure is to provide an electromagnetic shielding structure and a manufacturing method thereof, and an electronic device, aiming at solving the problem of prohibitive manufacturing cost and a cumbersome manufacturing process for an existing electromagnetic shielding structure.

To achieve the above objective, an embodiment of the present disclosure provides a manufacturing method of an electromagnetic shielding structure. The manufacturing method includes the following steps:
 covering an injection mold on a circuit substrate, so that different circuit units on the circuit substrate are respectively accommodated in different injection molding cavities of the injection mold;
 injecting a non-conductive plastic sealant into the injection molding cavities so as to form non-conductive plastic sealing bodies on the circuit units, wherein spacing grooves are formed between the non-conductive plastic sealing bodies; and
 forming a conductive shielding layer on the non-conductive plastic sealing bodies, so that the conductive shielding layer covers the non-conductive plastic sealing bodies and fills the spacing grooves to form shielding barrier walls, thereby realizing shielding between the different circuit units in respective cavities.

Preferably, after the step of injecting the non-conductive plastic sealant into the injection molding cavities, the manufacturing method further includes:
 solidifying the non-conductive plastic sealing bodies; and
 demolding the non-conductive plastic sealing bodies.

Preferably, the step of forming the conductive shielding layer on the non-conductive plastic scaling bodies includes:
 filling a compression mold with a conductive plastic sealant;
 pressing the circuit substrate into the compression mold, so that the conductive plastic sealant fills the spacing grooves and covers the non-conductive plastic sealing bodies; and
 solidifying the conductive plastic sealant to form the conductive shielding layer.

Preferably, the step of forming the conductive shielding layer on the non-conductive plastic sealing bodies includes:
 filling the spacing grooves with metal conductive liquid to form the shielding barrier walls; and
 forming a surface isolation layer on the non-conductive plastic sealing bodies through a surface spray-coating process, wherein the surface isolation layer is connected to the isolation barrier walls to form the conductive shielding layer.

Preferably, the step of forming the conductive shielding layer on the non-conductive plastic sealing bodies includes:
 filling the spacing grooves with metal conductive liquid to form shielding barrier walls; and
 forming a surface isolation layer on the non-conductive plastic sealing bodies through a surface sputtering process, the surface isolation layer being connected to the isolation barrier walls to form the conductive shielding layer.

To achieve the above objective, the present disclosure further provides an electromagnetic shielding structure. The electromagnetic shielding structure includes: a circuit substrate, at least two non-conductive plastic sealing bodies and a conductive shielding layer, wherein the circuit substrate is provided with at least two spaced circuit units; the non-conductive plastic sealing bodies are in one-to-one correspondence with the circuit units, and spacing grooves are formed between the non-conductive plastic sealing bodies; and the conductive shielding layer covers the non-conductive plastic sealing bodies, and the conductive shielding layer fills the spacing grooves to form shielding barrier walls, thereby realizing shielding between the different circuit units in respective cavities.

Preferably, an opening size of the spacing grooves is greater than a bottom size thereof, and groove walls of the spacing grooves are arranged in a slope manner.

Preferably, an opening size of the spacing grooves is greater than a bottom size thereof, and groove walls of the spacing grooves are arranged in a stepped manner.

Preferably, a projection of each of the circuit unit on the circuit substrate falls within a center position of a projection of a respective one of the non-conductive plastic scaling bodies on the circuit substrate.

To achieve the above objectives, the present disclosure further provides an electronic device. The electronic device includes the electromagnetic shielding structure according to any one of the above paragraphs.

According to a technical solution of the present disclosure, different circuit units are respectively accommodated in different injection molding cavities of the injection mold, the non-conductive plastic sealant is injected into the injection molding cavities to form non-conductive plastic sealing bodies, spacing grooves are formed between the non-conductive plastic sealing bodies, and the conductive shielding layer fills the spacing grooves to form the shielding barrier walls when the conductive shielding layer is formed on the non-conductive shielding plastic scaling bodies, thereby realizing shielding between the different circuit units in respective cavities and achieving a good shielding effect. The spacing grooves are formed in the injection molding process without laser trenching, so the manufacturing cost of the shielding structure is greatly reduced; and in one-time injection molding process, the spacing grooves between a plurality of circuit units can be formed at one time without the need to dig grooves one by one, so that the manufacturing process of the spacing grooves and the shielding structure is simplified.

BRIEF DESCRIPTION OF THE DRAWINGS

To describe the technical solutions in the embodiments of the present disclosure or in the prior art more clearly, the following briefly describes the accompanying drawings required for describing the examples or the prior art. Apparently, the accompanying drawings described below just illustrate some of the embodiments of the present disclosure, and more drawings can still be derived by a person of ordinary skill in the art from such accompanying drawings without creative efforts.

The implementation of objectives, functional characteristics, and advantages of the present disclosure will be further described with reference to the accompanying drawings.

DETAILED DESCRIPTION OF EMBODIMENTS

The following clearly and completely describes the technical solutions in the embodiments of the present disclosure with reference to the accompanying drawings in the embodiments of the present disclosure. Apparently, the described embodiments are merely a part rather than all of the embodiments of the present disclosure. All other embodiments obtained by a person of ordinary skill in the art based on the embodiments of the present disclosure without creative efforts shall fall within the protection scope of the present disclosure. All other embodiments obtained by a person of ordinary skill in the art based on the examples of the present disclosure without creative efforts shall fall within the protection scope of the present disclosure.

It should be noted that all the directional indications (such as upper, lower, left, right, front, back, etc.) in the embodiments of the present disclosure are merely used to explain a relative position relationship, motion situations and the like of the components in a specific gesture (as shown in the figures). If the specific gesture changes, the directivity indication also changes accordingly.

Furthermore, the technical solutions between the various embodiments may be combined with each other, provided that the combination thereof can be implemented by a person of ordinary skill in the art. In case of a contradiction with the combination of the technical solutions or a failure to implement the combination, it should be considered that the combination of the technical solutions does not exist, and is not within the protection scope of the present disclosure.

Figure 1:
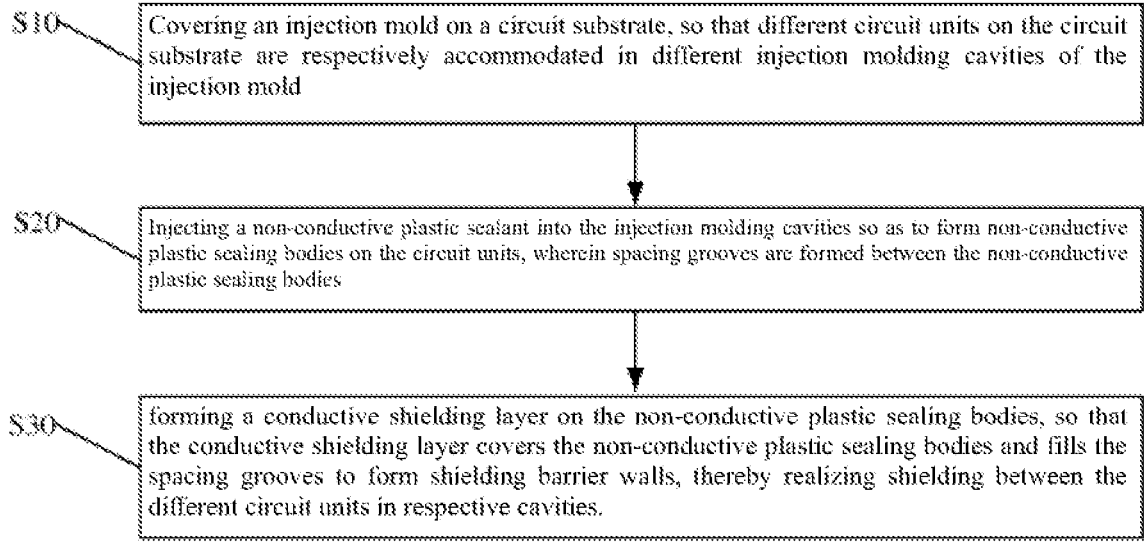
FIG. 1 is a flow schematic diagram of a manufacturing method of an electromagnetic shielding structure according to the present disclosure.
Figure 2A:
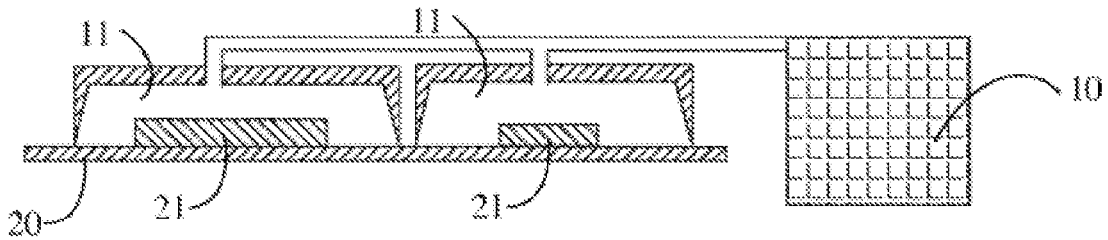
FIGS. 2a~2f are process flowcharts of a manufacturing method of an electromagnetic shielding structure according to the present disclosure.
Figure 2B:
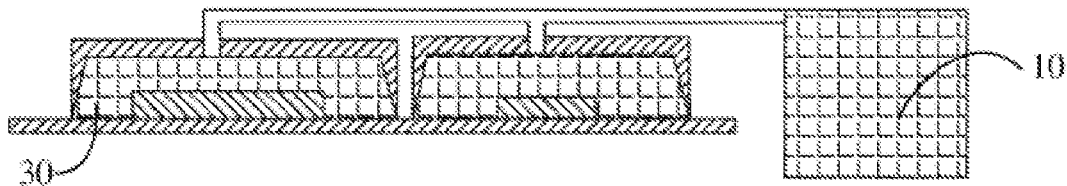
Figure 2C:
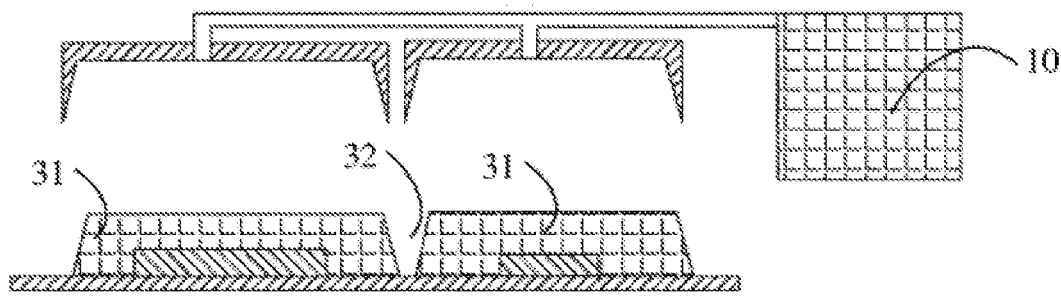
Figure 2D:
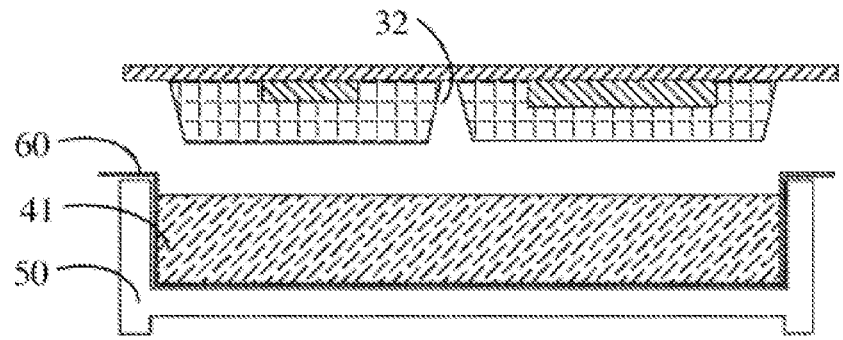
Figure 2E:
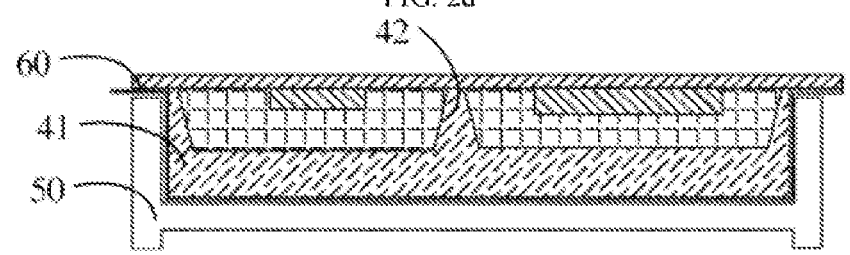
Figure 2F:
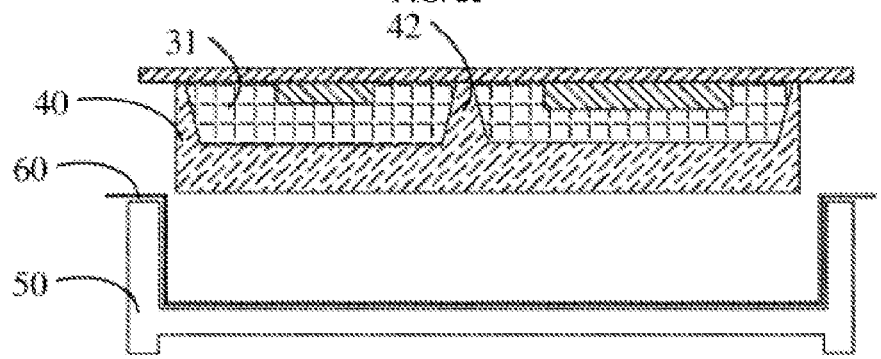
Figure 3:
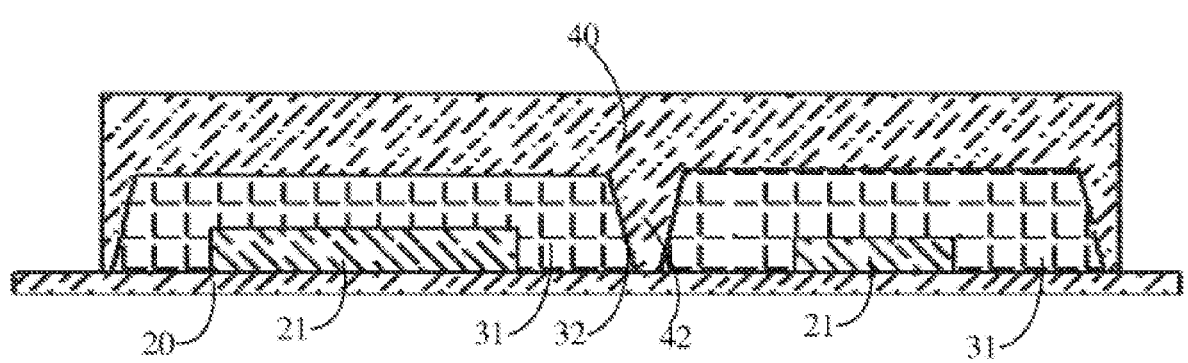
FIG. 3 is a structural schematic diagram of an electromagnetic shielding structure according to the present disclosure.

Referring to FIG. 1 to FIG. 3, FIG. 2 is a schematic diagram of covering an injection mold 10 on a circuit substrate 20 according to a manufacturing method of an electromagnetic shielding structure 100; FIG. 2b is a schematic diagram of injecting a non-conductive plastic sealant 30 into the injection molding cavity 11 and performing solidifying; FIG. 2c is a schematic diagram of demolding the injection mold 10; FIG. 2d is a schematic diagram of filling a conductive plastic sealant 41 into a compression mold 50; FIG. 2e is a schematic diagram of pressing the circuit substrate 20 into the compression mold 50 and performing solidifying; and FIG. 2f is a schematic diagram of demolding the compression mold. As a first embodiment of the manufacturing method of the electromagnetic shielding structure 100 according to the present disclosure, the manufacturing method includes:

step S10: a circuit substrate 20 is covered with an injection mold 10, so that different circuit units 21 on the circuit substrate 20 are respectively accommodated in different injection molding cavities 11 of the injection mold 10.

In this embodiment, the injection mold 10 is a special-shaped injection mold 10, a plurality of independent and spaced injection molding cavities 11 are formed on the injection mold 10, the number of the injection molding cavities 11 correspond to the number of the circuit units 21 on the circuit substrate 20, and a plurality of circuit units 21 on the circuit substrate 20 are arranged at intervals, thereby facilitating the subsequent cutting of the circuit units 21 into separate circuit modules. When the circuit substrate 20 is covered with the injection mold 10, each circuit unit 21 is correspondingly accommodated in the injection mold cavity 11, and the circuit unit 21 is sealed in the injection molding cavity 11.

Step S20: a non-conductive plastic sealant 30 is injected into the injection molding cavities 11 so as to form non-conductive plastic scaling bodies 31 on the circuit units 21, wherein spacing grooves 32 are formed between the non-conductive plastic sealing bodies 31.

In this embodiment, the non-conductive plastic sealant 30 is injected into different injection molding cavities 11 respectively, the non-conductive plastic sealant 30 may be epoxy resin or other plastic sealing bodies, and additives such as an activating agent and a coupling agent are added into the non-conductive plastic sealant 30, so that the non-conductive plastic sealant 30 has higher thermoplasticity and plastic sealing of the circuit units 21 is facilitated.

In this embodiment, the circuit units 21 are arranged at intervals and the injection molding cavities 11 are also arranged at intervals, therefore, after injection molding on the injection molding cavities 11, the non-conductive plastic sealing bodies 31 which plastically seal the circuit units 21 are also arranged at intervals, that is, spacing grooves 32 are formed between the non-conductive plastic scaling bodies 31. The spacing grooves 32 are to be filled with a conductive material to form shielding barrier walls 42 between the circuit units 21, thereby preventing electromagnetic interference between the circuit units 21.

Step S30: a conductive shielding layer 40 is formed on the non-conductive plastic sealing bodies 31, so that the conductive shielding layer 40 covers the non-conductive plastic sealing bodies 31, the spacing grooves 32 are filled with the conductive shielding layer 40 to form shielding barrier walls 42, realizing shielding between the different circuit units 21 in respective cavities.

In this embodiment, the conductive shielding layer 40 entirely covers the non-conductive plastic sealing bodies 31, a shielding cover is formed between the conductive shielding layer 40 and the circuit substrate 20 to shield the electromagnetic interference of an external electromagnetic signal on the circuit units 21 the conductive shielding layer 40 fills the spacing grooves 32 to form shielding barrier walls 42 between the circuit units 21, and the shielding barrier walls 42 divides the shielding space formed by the shielding cover into different shielding cavities according to the circuit units 21, thereby preventing electromagnetic interference between the circuit units 21, that is, to realize shielding between different circuit units 21 in respective cavities, by the shielding barrier walls 42.

In conclusion, according to the technical solution of the present disclosure, different circuit units 21 are respectively accommodated in different injection molding cavities 11 of the injection mold 10, the non-conductive plastic sealant 30 is injected into the injection molding cavities 11 to form non-conductive plastic sealing bodies 31, the spacing grooves 32 are formed between the non-conductive plastic sealing bodies 31, and the conductive shielding layer 40 fills the spacing grooves 32 to form the shielding barrier walls 42 when the conductive shielding layer 40 is formed on the non-conductive shielding plastic sealing bodies 31, so as to realize shielding between different circuit units 21 in respective cavities and achieve a good shielding effect. The spacing grooves 32 is formed in the injection molding process without laser trenching, so the manufacturing cost of the shielding structure is greatly reduced; and in one-time injection molding process, the spacing grooves between a plurality of circuit units 21 can be formed at one time and without the need to dig grooves one by one, so that the manufacturing process of the spacing grooves 32 and the shielding structure is simplified.

Figure 4:
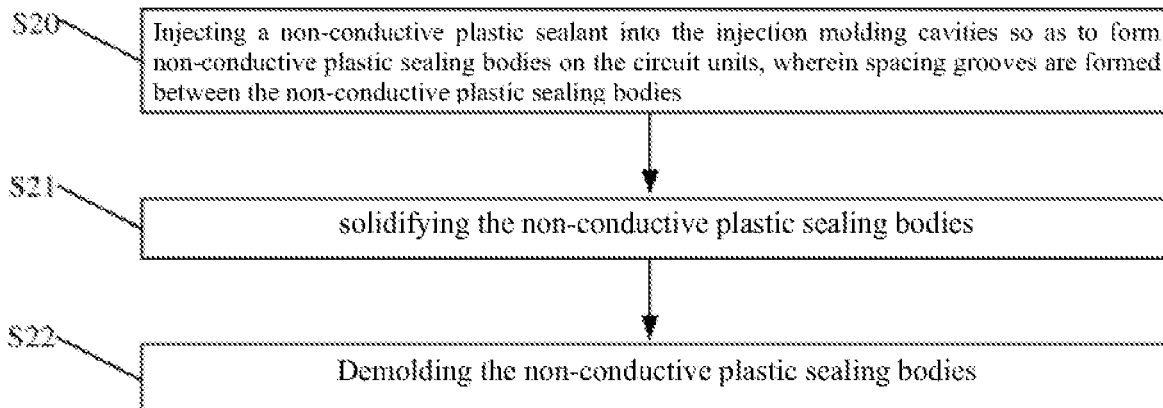
FIG. 4 is a flow schematic diagram of a second embodiment of an electromagnetic shielding structure according to the present disclosure.
Figure 5:
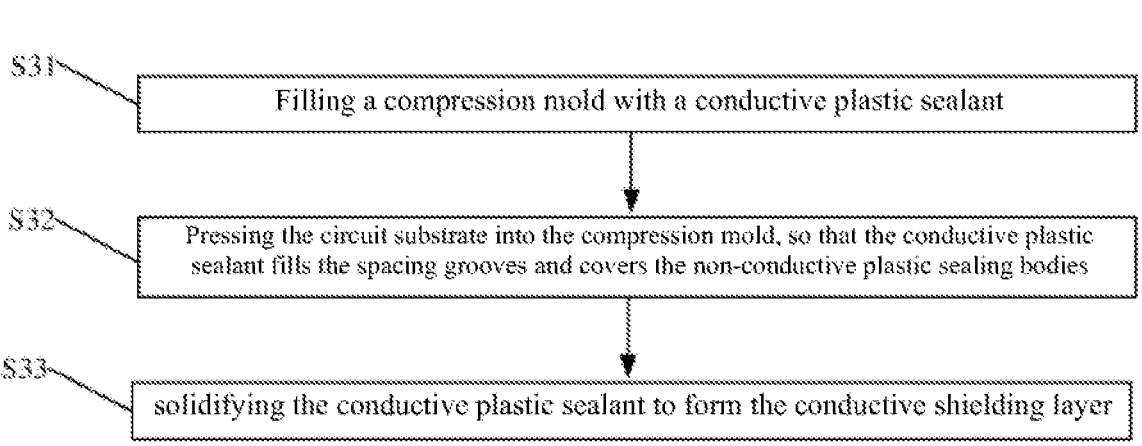
FIG. 5 is a specific flow schematic diagram of a step S30 in a first embodiment of an electromagnetic shielding structure according to the present disclosure.

Referring to FIG. 2 to FIG. 4, preferably, based on the first embodiment, as a second embodiment of the manufacturing method of the electromagnetic shielding structure 100 according to the present disclosure, after the step S20, the manufacturing method further includes:

step S21: the non-conductive plastic sealing bodies 31 are solidified; and step S22: the non-conductive plastic sealing bodies 31 are demolded.

In this embodiment, the non-conductive plastic sealing bodies 31 has thermoplasticity, the non-conductive plastic sealing bodies 31 are liquid during injection molding at high temperatures, and the non-conductive plastic sealing bodies 31 are solid at low temperatures, so it is necessary to solidify the non-conductive plastic sealing bodies 31 after the injection molding operation is completed, and deformation of the non-conductive plastic sealing bodies 31 caused by that the non-conductive plastic sealing bodies 31 are demolded without being solidified can be avoided. It may be understood that the solidifying time may be determined according to the actual situation. In order to accelerate the manufacturing process, the non-conductive plastic sealing bodies 31 can be demolded when being solidified to a predetermined degree such as 90%, and at this time, the non-conductive plastic sealing bodies 31 are substantially solidified, without causing deformation. After the non-conductive plastic sealing bodies 31 are demolded, the conductive shielding layer 40 may be formed on the non-conductive plastic sealing bodies 31.

Referring to FIG. 2 to FIG. 5, preferably, based on the first and second embodiments, as a third embodiment of the manufacturing method of the electromagnetic shielding structure 100 according to the present disclosure, after the step S30, the manufacturing method further includes:

step S31: a compression mold 50 is filled with a conductive plastic sealant 41;

step S32: the circuit substrate 20 is pressed into the compression mold 50, so that the spacing grooves 32 are filled with the conductive plastic sealant 41 and the non-conductive plastic sealing bodies 31 are covered; and step S33: the conductive plastic sealant 41 is solidified to form the conductive shielding layer 40.

In this embodiment, the conductive plastic sealant 41 in the compression mold 50 is in a molten state. The molten conductive plastic sealant 41, may be changed into liquid state from solid state in the compression mold 50, or may be directly injected at liquid state into the compression mold 50. In the case that the compression mold 50 forms a larger cavity for the circuit substrate 20 to be pressed up and down, the non-conductive plastic sealing bodies 31 are located in the compression mold 50, and the circuit substrate 20 abuts against the upper edge of the compression mold 50 to form a closed cavity. The closed cavity is filled with the molten conductive plastic sealant 41, and the spacing grooves 32 between the non-conductive plastic sealing bodies 31 will be filled with the conductive plastic sealant 41 to form a shielding barrier walls 42: meanwhile, the conductive plastic sealant 41 forms a surface shielding layer on the surfaces of each of the non-conductive plastic sealing bodies 31, where the surface shielding layer and the shielding barrier walls 42 are solidified to jointly form the conductive shielding layer 40, so as to realize shielding between the circuit units 21 in respective cavities. In this embodiment, the plurality of spacing grooves 32 are filled with the conductive plastic sealant 41 at one time through the compression mold 50, so that the plastic sealing efficiency is improved, the production flow is simplified, and the production cost is reduced.

In addition, one layer of centrifugal film 60 is arranged between the conductive plastic sealant 41 and the compression mold 50, and the centrifugal film 60 may reduce the difficulty of demolding the conductive shielding layer 40, so as to prevent the defect of the conductive shielding layer 40 caused by adhesion between the conductive shielding layer 40 and the compression mold 50. In addition, the thickness of the conductive shielding layer 40 may be adjusted by adjusting the height of the centrifugal film 60 in the compression mold 50 since the conductive shielding layer 40 with different thickness will have different shielding effects, thereby the conductive shielding layer 40 meeting the shielding effects required by different circuit units 21.

Figure 6:
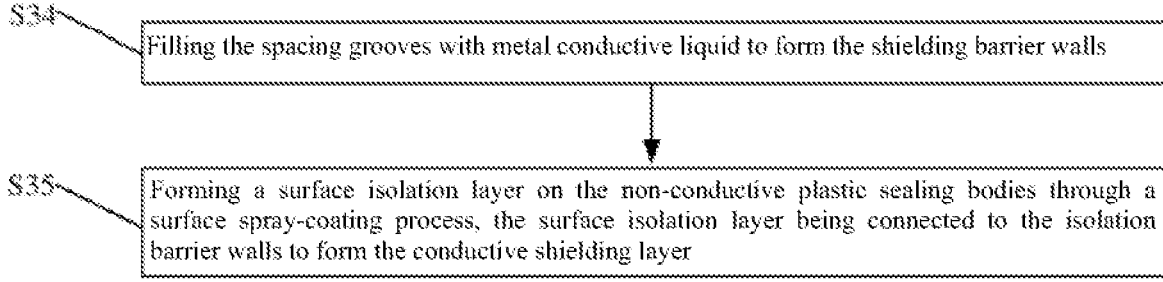
FIG. 6 is another specific flow schematic diagram of a step S30 in a first embodiment of an electromagnetic shielding structure according to the present disclosure.

Referring to FIG. 3 and FIG. 6, based on the first and second embodiments, as a variant, the step S30 includes:

step S34: the spacing grooves 32 are filled with metal conductive liquid to form the shielding barrier walls 42; and step S35: a surface isolation layer is formed on the non-conductive plastic sealing bodies 31 through a surface spray-coating process, wherein the surface isolation layer is connected to the isolation barrier walls to form the conductive shielding layer 40.

In this embodiment, the spacing grooves 32 are filled with metal conductive liquid such as silver paste, and the metal conductive liquid forms the shielding barrier walls 42 after being solidified. Since the spacing grooves 32 are formed in the injection molding process, the spacing grooves 32 may be set to be wider as required, e.g. 200 mm wide, and the shielding barrier walls 42 may be made thicker. By contrast, in laser trenching, the spacing grooves 32 are generally set to be narrower for cost reasons, leading to thin shielding barrier walls 42 and poor shielding effect. After the isolation barrier walls are formed, the non-conductive plastic sealing bodies 31 and the isolation barrier walls are spray-coated with metal liquid or metal fog through a surface spray-coating process to form a surface isolation layer, and the surface isolation layer is connected to the isolation barrier walls to form the conductive shielding layer 40, so as to realize shielding between the circuit units 21 in respective cavities.

Figure 7:
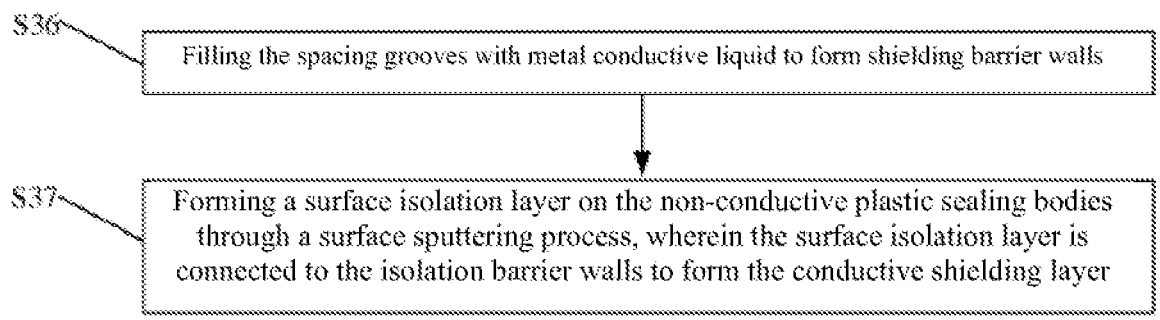
FIG. 7 is yet another specific flow schematic diagram of a step S30 in a first embodiment of an electromagnetic shielding structure according to the present disclosure.

Referring to FIG. 3 and FIG. 7, based on the first and second embodiments, as a variant, the step S30 includes:

step S36: the spacing grooves 32 are filled with metal conductive liquid to form shielding barrier walls 42; and step S37: a surface isolation layer is formed on the non-conductive plastic sealing bodies 31 through a surface sputtering process, wherein the surface isolation layer is connected to the isolation barrier walls to form the conductive shielding layer 40.

In this embodiment, the spacing grooves 32 are filled with metal conductive liquid such as silver paste, and the metal conductive liquid forms the shielding barrier walls 42 after being solidified. Since the spacing grooves 32 are formed in the injection molding process, the spacing grooves 32 may be set to be wider such as 200 mm as required, and the shielding barrier walls 42 may be made thicker. In order to save cost during laser trenching, the spacing grooves 32 are generally set to be smaller, which leads to thin shielding barrier walls 42 and poor shielding effect. After the isolation barrier walls are formed, the surface isolation layer is formed on the non-conductive plastic sealing bodies 31 and the isolation barrier walls through a surface sputtering process, and the surface sputtering process bombards the metal solid surface with particles (ions or neutral atoms and molecules) with a certain energy, so that the atoms or molecules near the surface of the metal solid obtain sufficient energy to finally escape from the solid surface and collide with the non-conductive plastic sealing bodies 31 and the isolation barrier walls to form the surface isolation layer, the surface isolation layer is connected to the isolation barrier walls to form the conductive shielding layer 40, realizing shielding between the circuit units 21 in respective cavities.

Referring to FIG. 3, to achieve the above objective, the present disclosure further provides an electromagnetic shielding structure 100. The electromagnetic shielding structure 100 is manufactured by the manufacturing method as described above. The electromagnetic shielding structure 100 includes: a circuit substrate 20, at least two non-conductive plastic sealing bodies 31 and a conductive shielding layer 40, wherein the circuit substrate 20 is provided with at least two spaced circuit units 21; the non-conductive plastic sealing bodies 31 are in one-to-one correspondence with the circuit units 21, and spacing grooves 32 are formed between the non-conductive plastic sealing bodies 31; and the conductive shielding layer 40 covers the non-conductive plastic sealing bodies 31, and the conductive shielding layer 40 fills the spacing grooves 32 to form shielding barrier walls 42, so as to realize shielding between the different circuit units 21 in respective cavities.

In this embodiment, the non-conductive plastic sealing bodies 31 are formed by the injection mold 10 through injection molding; the injection mold 10 is a special-shaped injection mold 10, a plurality of independent and spaced injection molding cavities 11 are formed on the injection mold 10, the number of the injection molding cavities 11 correspond to the number of the circuit units 21 on the circuit substrate 20, and a plurality of circuit units 21 on the circuit substrate 20 are arranged at intervals, thereby facilitating the subsequent cutting of the circuit units 21 into separate circuit modules. When the circuit substrate 20 is covered with the injection mold 10, each circuit unit 21 is correspondingly accommodated in a respective injection mold cavity 11, where the circuit unit 21 is sealed in the injection molding cavity 11.

The non-conductive plastic sealant 30 is injected into different injection molding cavities 11 respectively through an injection molding machine, non-conductive plastic sealant 30 may be epoxy resin or other plastic sealing bodies with additives such as an activating agent and a coupling agent, so that the non-conductive plastic sealant 30 has higher thermoplasticity and can plastically seal the circuit units 21 better. Since the circuit units 21 are arranged at intervals and the injection molding cavities 11 are also arranged at intervals, after injection molding on the injection molding cavities 11, the non-conductive plastic sealing bodies 31 which plastically seal the circuit units 21 are also arranged at intervals. That is, spacing grooves 32 are formed between the non-conductive plastic sealing bodies. The spacing grooves 32 are to be filled with a conductive material to form shielding barrier walls 42 between the circuit units 21, thereby preventing electromagnetic interference between the circuit units 21.

The conductive shielding layer 40 entirely covers the non-conductive plastic sealing bodies 31, a shielding cover is formed between the conductive shielding layer 40 and the circuit substrate 20 to shield the electromagnetic interference of external electromagnetic signals on the circuit units 21, the conductive shielding layer 40 fills the spacing grooves 32 to form shielding barrier walls 42 between the circuit units 21, and the shielding barrier walls 42 divide the shielding space formed by the shielding cover into different shielding cavities according to the circuit units 21, so that electromagnetic interference between the circuit units 21 is prevented, that is, to realize shielding between different circuit units 21 in respective cavities through the shielding barrier walls 42.

In this embodiment, the circuit power supply may be any circuit requiring electromagnetic signal shielding, such as a radio frequency circuit, a pressure sensor and a photosensitive component.

In conclusion, according to the technical solution of the present disclosure, different circuit units 21 are respectively accommodated in different injection molding cavities 11 of the injection mold 10, the non-conductive plastic sealant 30 is injected into the injection molding cavities 11 to form non-conductive plastic sealing bodies 31, the spacing grooves 32 are formed between the non-conductive plastic sealing bodies 31, and the conductive shielding layer 40 fills the spacing grooves 32 to form the shielding barrier walls 42 when the conductive shielding layer 40 is formed on the non-conductive shielding plastic sealing bodies 31, thereby realizing shielding between different circuit units 21 in respective cavities and achieving a good shielding effect. Since the spacing grooves 32 are formed in the injection molding process without laser trenching, the manufacturing cost of the shielding structure is greatly reduced. In addition, since the spacing grooves between a plurality of circuit units 21 can be formed at one time and in one-time injection molding process without the need to dig grooves one by one, the manufacturing process of the spacing grooves 32 and the shielding structure is simplified.

Preferably, an opening size of the spacing grooves 32 is greater than a bottom size thereof, and groove walls of the spacing grooves 32 are arranged in a slope manner.

In this embodiment, since the injection molding cavity 11 of the injection mold 10 is provided as a structure with a small upper part and a big lower part, and the groove walls of the spacing grooves 32 are arranged in a slope manner after the steps of injection molding, solidification and demolding, on one hand, the difficulty of demolding the injection mold 10 can be reduced, on the other hand, the opening size of the spacing grooves 32 is greater than the groove bottom size, thereby facilitating injection of the silver paste or the conductive plastic sealant 41 into the spacing grooves 32 for filling in the process of forming the shielding barrier walls 42, and reducing the manufacturing difficulty.

As a variant, preferably, an opening size of the spacing grooves 32 is greater than a bottom size thereof, and groove walls of the spacing grooves 32 are arranged in a stepped manner.

In this embodiment, since the injection molding cavity 11 of the injection mold 10 is provided as a stepped structure with a small upper part and a big lower part, and the groove walls of the spacing grooves 32 are arranged in a stepped manner after the steps of injection molding, solidification and demolding, on one hand, the difficulty of the injection mold 10 during demolding can be reduced, on the other hand, the opening size of the spacing grooves 32 is greater than the groove bottom size, thereby facilitating injection of the silver paste or the conductive plastic sealant 41 into the spacing grooves 32 for filling in the process of forming the shielding barrier walls 42, and reducing the manufacturing difficulty.

Referring to FIG. 3, projections of each of the circuit units 21 on the circuit substrate 20 are within a center position of a projection of each of the non-conductive plastic sealing bodies 31 on the circuit substrate 20.

In this embodiment, a circuit unit 21 is located at the central position of the bottom of the injection molding cavity 11 in the injection molding process, and the circuit unit 21 is located at the central position of a non-conductive plastic sealing body 31 after injection molding. That is, the projection of the circuit unit 21 on the circuit substrate 20 falls within the center position of the projection of the non-conductive plastic sealing body 31 on the circuit substrate 20, so that the circuit module is plastically sealed uniformly and a better plastic scaling effect is achieved, thereby preventing the abnormal function of the circuit unit 21 due to exposure of the circuit unit 21 on the non-conductive plastic sealing body 31 caused by non-uniform plastic sealing.

To achieve the above objective, the present disclosure further provides an electronic device. The electronic device includes the electromagnetic shielding structure 100 as described above. The electronic device includes the electromagnetic shielding structure 100, and the electronic device at least has the effective effects of the electromagnetic shielding structure 100, which is not elaborated herein.

Described above are the preferred embodiments of the present disclosure and are not intended to limit the patent scope of the present disclosure. Any equivalent structural variant based on the contents of the specification and the accompanying drawings of the present disclosure or directly/indirectly applied to other related technical fields within the conception of the present disclosure shall fall within the patent protection scope of the present disclosure.

The invention claimed is:

1. A manufacturing method of an electromagnetic shielding structure, comprising:
  covering an injection mold on a circuit substrate having a plurality of circuit units, so that each of the plurality of circuit units on the circuit substrate are accommodated in a respective one of a plurality of injection molding cavities of the injection mold;
  injecting a non-conductive plastic sealant into the plurality of injection molding cavities to form a plurality of non-conductive plastic sealing bodies on the circuit units, wherein spacing grooves are formed between each of the plurality of non-conductive plastic sealing bodies; and
  forming a conductive shielding layer on the plurality of non-conductive plastic sealing bodies, so that the conductive shielding layer covers the plurality of non-conductive plastic sealing bodies and fills the plurality of spacing grooves to form plurality of shielding barrier walls, thereby shielding between neighboring circuit units of the plurality of circuit units in respective cavities,
  wherein the forming the conductive shielding layer on the plurality of non-conductive plastic sealing bodies comprises:
    filling a compression mold with a conductive plastic sealant;
    pressing the circuit substrate into the compression mold, so that the conductive plastic sealant fills the plurality of spacing grooves and covers the plurality of non-conductive plastic sealing bodies; and
    solidifying the conductive plastic sealant to form the conductive shielding layer.

2. The manufacturing method of the electromagnetic shielding structure of claim 1, further comprising, after the injecting,
  solidifying the plurality of non-conductive plastic sealing bodies; and
  demolding the plurality of non-conductive plastic sealing bodies.

3. The manufacturing method of the electromagnetic shielding structure of claim 1, further comprising, arranging one layer of centrifugal film between the conductive plastic sealant and the compression mold so that thickness of the conductive shielding layer is adapted to be adjusted by adjusting height of the centrifugal film in the compression mold.

4. An electromagnetic shielding structure, comprising:
  a circuit substrate, the circuit substrate being provided with at least two spaced circuit units;
  at least two non-conductive plastic sealing bodies arranged in a one-to-one correspondence with the at least two circuit units, and at least one spacing groove formed between the at least two non-conductive plastic sealing bodies; and
  a conductive shielding layer, the conductive shielding layer covering the at least two non-conductive plastic sealing bodies, and filling the at least one spacing groove to form at least one shielding barrier wall, thereby shielding between neighboring circuit units of the at least two circuit units in respective cavities, wherein the conductive shielding layer is formed by filling a compression mold with a conductive plastic sealant, pressing the circuit substrate into the compression mold so that the conductive plastic sealant fills the at least one spacing groove and covers the at least two non-conductive plastic sealing bodies, and solidifying the conductive plastic sealant to form the conductive shielding layer.

5. The electromagnetic shielding structure of claim 4, wherein an opening size of the at least one spacing groove is greater than a bottom size thereof, and groove walls of the at least one spacing groove is arranged in a slope manner.

6. The electromagnetic shielding structure of claim 4, wherein an opening size of the at least one spacing groove is greater than a bottom size thereof, and groove walls of the at least one spacing groove is arranged in a stepped manner.

7. The electromagnetic shielding structure of claim 4, wherein a projection of each of the at least two circuit units on the circuit substrate falls within a center position of a projection of a respective one of the at least two non-conductive plastic sealing bodies on the circuit substrate.

8. An electronic device, comprising the electromagnetic shielding structure of claim 4.

\* \* \* \* \*